(12) United States Patent
Teh

(10) Patent No.: US 10,141,914 B2
(45) Date of Patent: Nov. 27, 2018

(54) OSCILLATION CIRCUIT

(71) Applicant: KABUSHIKI KAISHA TOSHIBA, Tokyo (JP)

(72) Inventor: Chen Kong Teh, Ota Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 91 days.

(21) Appl. No.: 15/253,512

(22) Filed: Aug. 31, 2016

(65) Prior Publication Data

US 2017/0237413 A1  Aug. 17, 2017

(30) Foreign Application Priority Data

Feb. 17, 2016  (JP) .................. 2016-028213

(51) Int. Cl.
| | |
|---|---|
| *H03K 3/011* | (2006.01) |
| *H03K 3/03* | (2006.01) |
| *H03K 3/0231* | (2006.01) |
| *H03L 1/02* | (2006.01) |
| *H03K 3/354* | (2006.01) |

(52) U.S. Cl.
CPC ........... *H03K 3/011* (2013.01); *H03K 3/0231* (2013.01); *H03K 3/0315* (2013.01); *H03K 3/354* (2013.01); *H03L 1/022* (2013.01)

(58) Field of Classification Search
CPC ..... H03K 3/011; H03K 3/0315; H03K 3/0231
See application file for complete search history.

(56) References Cited

U.S. PATENT DOCUMENTS

| | | | |
|---|---|---|---|
| 5,870,345 A | 2/1999 | Stecker | |
| 6,020,792 A | 2/2000 | Nolan et al. | |
| 6,356,161 B1 * | 3/2002 | Nolan | H03K 3/011 |
| | | | 331/111 |
| 6,992,533 B2 * | 1/2006 | Hollinger | H03K 3/011 |
| | | | 331/111 |
| 7,391,276 B2 | 6/2008 | Sakaguchi | |

FOREIGN PATENT DOCUMENTS

| | | |
|---|---|---|
| JP | 2003-283305 A | 10/2003 |
| JP | 4684616 B2 | 5/2011 |
| JP | 5807508 B2 | 11/2015 |

OTHER PUBLICATIONS

Japanese Office Action dated Jun. 26, 2018, filed in counterpart Japanese Patent Application No. 2016-028213 (6 pages) (with machine translation).

* cited by examiner

*Primary Examiner* — Ryan Johnson
(74) *Attorney, Agent, or Firm* — Patterson & Sheridan, LLP

(57) ABSTRACT

An oscillation circuit includes a delay circuit that includes a first inverter having an input terminal connected to a first node, a delay adjustment circuit including first and second current supply paths through which the first node is charged in response to an output signal of the delay circuit. During charging of the first node, a current with positive temperature characteristics is supplied to the first node through the first current supply path, and a current with negative temperature characteristics is supplied to the first node through the second current supply path.

20 Claims, 6 Drawing Sheets

OSCILLATION CIRCUIT

CROSS-REFERENCE TO RELATED APPLICATION

This application is based upon and claims the benefit of priority from Japanese Patent Application No. 2016-028213, filed Feb. 17, 2016, the entire contents of which are incorporated herein by reference.

FIELD

Embodiments described herein relate generally to an oscillation circuit.

BACKGROUND

A technology of an oscillation circuit known as a ring oscillator having a configuration in which odd-numbered inverters are cascaded in a ring shape is known in the related art. An oscillation frequency of the ring oscillator is set by a delay time of each inverter. Thus, in a case where a ring oscillator with a low oscillation frequency is configured, the delay time is lengthened by, for example, increasing the size of a capacitor which is connected to an output terminal of each inverter. However, in a case where the size of the capacitor increases, power consumption increases when the capacitors are charged or discharged. In addition, the oscillation frequency varies depending on variation in manufacturing conditions or temperature change. Accordingly, it is preferable that an oscillation circuit is provided which can prevent the oscillation frequency from varying depending on variation in the manufacturing conditions or temperature change.

DETAILED DESCRIPTION

Embodiments provide an oscillation circuit which can reduce power consumption and prevent an oscillation frequency from varying depending on variation in manufacturing conditions or temperature change.

In general, according to one embodiment, an oscillation circuit includes a delay circuit that includes a first inverter having an input terminal connected to a first node, and a delay adjustment circuit including first and second current supply paths through which the first node is charged in response to an output signal of the delay circuit. During charging of the first node, a current with positive temperature characteristics is supplied to the first node through the first current supply path, and a current with negative temperature characteristics is supplied to the first node through the second current supply path.

Oscillation circuits according to embodiments are described in detail with reference to the accompanying drawings. Exemplary embodiments are not limited to the embodiments.

First Embodiment

Figure 1:
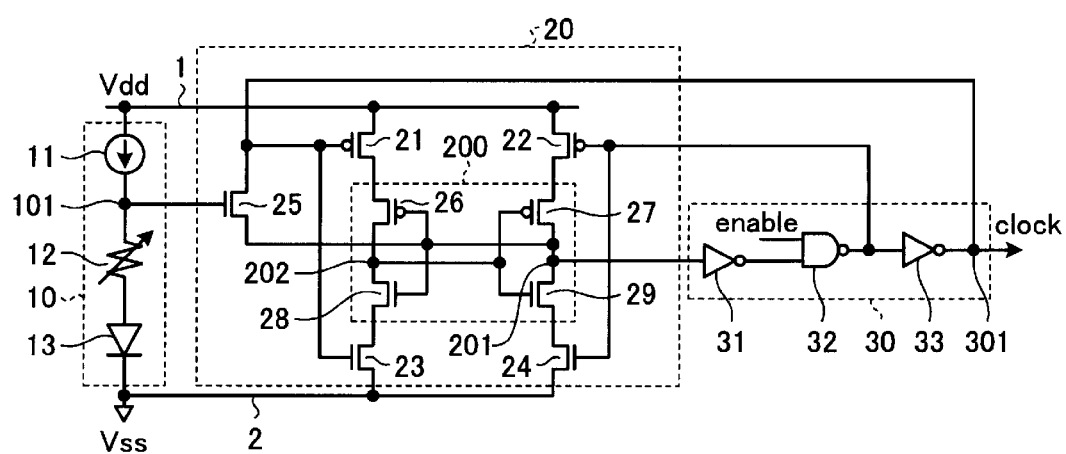
FIG. 1 is a diagram illustrating a configuration of an oscillation circuit according to a first embodiment.

FIG. 1 is a diagram illustrating a configuration of an oscillation circuit according to a first embodiment. The oscillation circuit according to the present embodiment includes a bias circuit 10. The bias circuit 10 includes a constant current source 11, a variable resistor 12, and a diode 13 that are connected in series between a first power supply line 1 to which a power supply voltage Vdd is applied and a second power supply line 2 to which a ground voltage Vss is applied. For example, the variable resistor 12 has a configuration in which multiple resistors (not illustrated) are connected in series, and multiple switches (not illustrated) are respectively connected in parallel with the multiple resistors, such that a resistance value of the variable resistor can be adjusted. Adjustment of the resistance value of the variable resistor 12 is described below.

The oscillation circuit according to the present embodiment includes a delay adjustment circuit 20. A gate of an NMOS transistor 25 (a bias transistor), which configures the delay adjustment circuit 20, is connected to a bias node 101 of the bias circuit 10. A connection point between the constant current source 11 and the variable resistor 12 forms the bias node 101.

The delay adjustment circuit 20 includes a PMOS transistor 21 and a PMOS transistor 22, each source of which is connected to the first power supply line 1. A drain of the NMOS transistor 25 (the bias transistor) is connected to a gate of the PMOS transistor 21.

The delay adjustment circuit 20 includes an NMOS transistor 23 and an NMOS transistor 24, each source of which is connected to the second power supply line 2. A gate of the NMOS transistor 23 is connected to a gate of the PMOS transistor 21, and a gate of the NMOS transistor 24 is connected to a gate of the PMOS transistor 22.

A latch circuit 200 is connected between drains of the PMOS transistors 21 and 22 and the NMOS transistors 23 and 24. The latch circuit 200 includes two PMOS transistors 26 and 27, and two NMOS transistors 28 and 29. A source of the PMOS transistor 26 is connected to a drain of the PMOS transistor 21, and a source of the PMOS transistor 27 is connected to a drain of the PMOS transistor 22.

A source of the NMOS transistor 28 is connected to the drain of the NMOS transistor 23, and a source of the NMOS transistor 29 is connected to the drain of the NMOS transistor 24. A gate of the PMOS transistor 26 and a gate of the NMOS transistor 28 are connected in common to a first node 201. A gate of the PMOS transistor 27 and a gate of the NMOS transistor 29 are connected in common to a second node 202. The PMOS transistor 26 and the NMOS transistor 28 form an inverter, and the PMOS transistor 27 and the NMOS transistor 29 also form an inverter. Hence, the latch circuit 200 includes two inverters in which an input of one inverter is cross-connected to an output of another inverter. A source of the NMOS transistor 25 is connected to the first node 201.

An oscillation circuit according to the present embodiment includes a delay circuit 30. The delay circuit 30 includes an inverter 31 whose input is connected to the first node 201, a NAND circuit 32 whose one input terminal receives an output of the inverter 31, and an inverter 33 which receives an output of the NAND circuit 32. The other input terminal of the NAND circuit 32 receives an enable signal enable. As the enable signal enable is supplied as a signal with an H level, the NAND circuit 32 inverts a signal which is supplied from the inverter 31 and outputs the inverted signal. That is, by supplying a signal with an H level as the enable signal enable, the NAND circuit 32 can operate as one inverter.

An output signal clock of the oscillation circuit is output from an output node 301 of the delay circuit 30. The output signal clock has a predetermined frequency. The predetermined frequency is determined by a mechanism is described below. An output terminal of the inverter 33 is connected to the gate of the PMOS transistor 21 of the delay adjustment circuit 20, and an output terminal of the NAND circuit 32 is connected to the gate of the PMOS transistor 22 of the delay adjustment circuit 20. That is, a signal of the output terminal of the inverter 33 of the delay circuit 30 is supplied to the gate of the PMOS transistor 21, and a signal of an input terminal of the inverter 33 is applied to the gate of the PMOS transistor 22. Thus, signals having an inverted relationship between each other, are respectively supplied to the gate of the PMOS transistor 21 and the gate of the PMOS transistor 22, from the delay circuit 30.

Figure 2A:
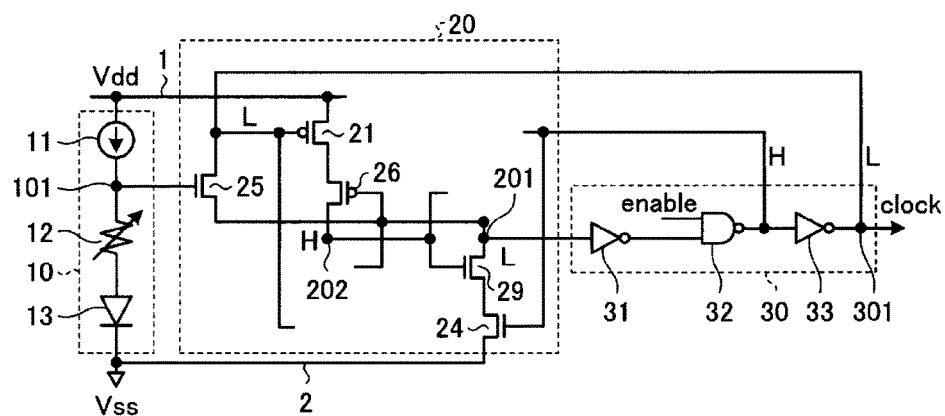
FIGS. 2A to 2C are diagrams illustrating a circuit operation of the oscillation circuit.

Subsequently, an operation of the oscillation circuit according to the present embodiment is described with reference to FIGS. 2A to 2C. The same symbols or reference numerals are given to the configuration elements corresponding to those in the embodiment in FIG. 1. FIG. 2A illustrates an initial state. Operation of a case starting from a signal level of the output signal clock of the output node 301 being an L level, and a voltage of the first node 201 transitions from an L level to an H level is described.

For the sake of convenience of description, a transistor which is turned off by a voltage that is applied to a gate thereof is not shown. That is, as an output signal of the NAND circuit 32 is in an H level, the PMOS transistor 22 of the delay adjustment circuit 20 illustrated in FIG. 1 is turned off, and thus, the PMOS transistor is not shown. In addition, as a voltage of the second node 202 is in an H level, the PMOS transistor 27 of the latch circuit 200 is also turned off, and thus, the PMOS transistor is not shown. In the same manner, the NMOS transistor 23 and the NMOS transistor 28, each gate of which receives a voltage with an L level, are turned off, and thus, the NMOS transistors are not shown.

Figure 2B:
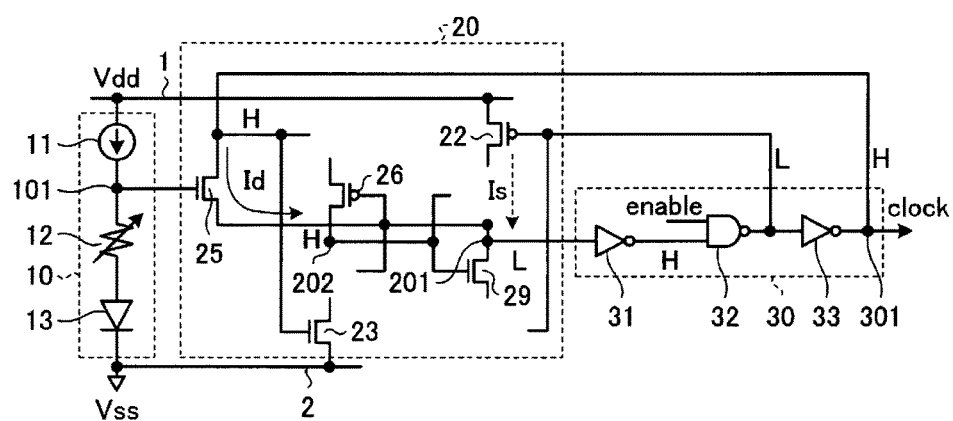

A voltage of the first node 201 is inverted by the inverter 31, the NAND circuit 32, and the inverter 33, from an initial state illustrated in FIG. 2A, and the output signal clock of the output node 301 goes to an H level, thereby entering a transition state illustrated in FIG. 2B.

In the transition state in FIG. 2B, since the output signal clock of the output node 301 is in an H level, a voltage of an H level is applied to the drain of the NMOS transistor 25. Accordingly, the NMOS transistor 25 supplies a drain current Id according to a voltage of the bias node 101 which is supplied by the bias circuit 10, to the first node 201. Meanwhile, the PMOS transistor 22 having a gate to which a signal with an L level is supplied is turned on. In FIG. 2B, the PMOS transistor 27 of the delay adjustment circuit 20 which is not illustrated receives a signal with an H level to a gate thereof, thereby being turned off. However, since the PMOS transistor 22 is turned on, a power supply voltage Vdd is applied to the source of the PMOS transistor 27, and a current supply path through which a leakage current Is of the PMOS transistor 27 flows is formed between the drain of the PMOS transistor 22 and the first node 201.

Figure 2C:
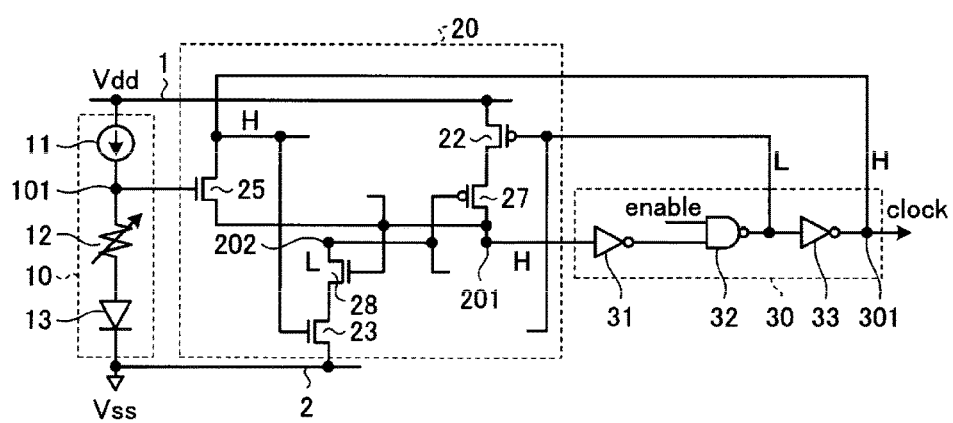

Next, transition to a state illustrated in FIG. 2C is described. A voltage of the first node 201 increases when the leakage current Is of the PMOS transistor 27 and a drain current Id of the NMOS transistor 25 are supplied to the first node. The reason is that, for example, a parasitic capacitor (not illustrated) existing in the first node 201 is charged by the leakage current Is and the drain current Id. If the voltage of the first node 201 increases, the NMOS transistor 28 having a gate to which the increased voltage is applied and the NMOS transistor 23 having a gate to which a signal with an H level of the output node 301 is applied are turned on, and a voltage of the second node 202 decreases to an L level. Thereby, a voltage with an L level is applied to the gate of the PMOS transistor 27, and thus, the PMOS transistor 27 is turned on, and the first node 201 is connected to the first power supply line 1 by a source-drain path of the PMOS transistor 22 and the PMOS transistor 27 which are turned on (FIG. 2C).

If a state in FIG. 2C is formed, the voltage, which has an H level at the first node 201 is inverted by the inverter 31, the NAND circuit 32, and the inverter 33, whereby a voltage of the output node 301 connected to the output terminal of the inverter 33 is changed to an L level since (not illustrated). If the voltage of the output node 301 goes to an L level, since the voltage of the first node 201 goes to an H level, a reverse bias is applied between a source and a drain of the NMOS transistor 25, and the first node 201 is discharged by a reverse current flowing the source to the drain of the NMOS transistor 25. In addition, at this time, since a signal with an H level is applied to the gate of the NMOS transistor 24 (not illustrated) from the NAND circuit 32, the NMOS transistor 24 is turned on, whereby the ground voltage Vss is applied to the source of the NMOS transistor 29 (not illustrated), and a current supply path through which the leakage current Is of the NMOS transistor 29 flows is formed between the first node 201 and the drain of the NMOS transistor 24. That is, the first node 201 is discharged by a current in a reverse direction which flows from the source to the drain of the NMOS transistor 25, and the leakage current Is of the NMOS transistor 29. A current in a reverse direction which flows from the source to the drain of the NMOS transistor 25 also has a negative temperature characteristic. The current in a reverse direction which flows from the source to the drain of the NMOS transistor 25 changes depending on a gate voltage Vg of the NMOS transistor 25, that is, the bias voltage which is supplied from the bias node 101. Hence, as the bias voltage, which is supplied from the bias circuit 10, has a negative temperature characteristic in which a voltage decreases according to an increase in temperature, the current in a reverse direction which flows from the source to the drain of the NMOS transistor 25 has a negative temperature characteristic in which the more the temperature increases, the more the current decreases.

The voltage of the first node 201 goes to an L level according to the discharging, thereby transitioning back to the initial state illustrated in FIG. 2A. Hereinafter, the aforementioned operations are repeated, whereby the circuit output oscillates.

As described above, the first node 201 connected to the inverter 31 of the delay circuit 30 is charged by the current supply path of the leakage current Is formed in the delay adjustment circuit 20 and the current supply path of the drain current Id of the NMOS transistor 25. The leakage current Is has a positive temperature characteristic. That is, the more the temperature increases, the more the leakage current Is flows. Meanwhile, the drain current Id which is supplied by the NMOS transistor 25 changes depending on the gate voltage Vg of the NMOS transistor 25, that is, the bias voltage which is supplied by the bias node 101. Hence, as the bias voltage which is supplied by the bias circuit 10 has a negative temperature characteristic, it is possible to provide a configuration in which the drain current Id with its negative temperature characteristic in which the more the temperature increases, the more the current decreases is supplied to the first node 201. As the configuration is provided in which the current supply path that supplies the leakage current Is with the positive temperature characteristics and the drain current Id with the negative temperature characteristics are included, and in which both temperature characteristics are offset, it is possible to provide a configuration in which the first node 201 is charged by a substantially constant current, i.e., one that is little affected by a temperature change. As a configuration is provided in which stable charging is performed without varying depending on the temperature change, it is possible to provide an oscillation circuit whose oscillation frequency is little affected by a temperature change. In addition, the first node 201 is also discharged by a sum of the leakage current Is of the NMOS transistor 29 with the positive temperature characteristics and the current in a reverse direction of the NMOS transistor 25 with the negative temperature characteristics, that is, a current in which the temperature characteristics are offset. Thus, it is possible to perform a stable discharging operation with respect to the temperature change.

Figure 3A:
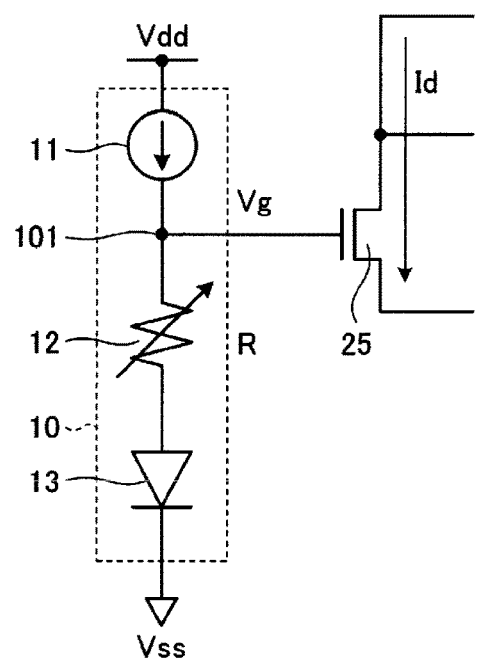
FIGS. 3A and 3B are diagrams illustrating correction of temperature characteristics.
Figure 3B:
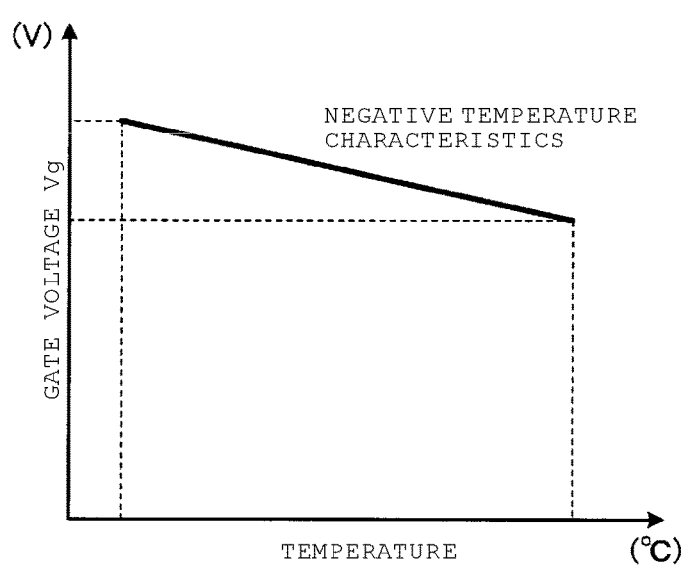

FIGS. 3A and 3B are diagrams illustrating correction of the temperature characteristics. The same symbols or reference numerals are given to configuration elements corresponding to those in the embodiment illustrated in FIG. 1. FIG. 3A illustrates the bias circuit 10 and the NMOS transistor 25. The diode 13 is configured by connecting a drain to a gate of, for example, an NMOS transistor (not illustrated). The variable resistor 12 has a configuration in which a switch (not illustrated) is connected in parallel with a resistance element (not illustrated) are connected in series. As the switch connected in parallel with the resistance element is appropriately turned on or off, it is possible to adjust a resistor value R of the variable resistor 12.

A connection point between the variable resistor 12 and the constant current source 11 forms the bias node 101. A voltage between an anode and a cathode of the diode 13, that is, a forward voltage has a negative temperature characteristic. That is, the forward voltage between the anode and the cathode of the diode 13 has a negative temperature characteristic in which the voltage decreases as temperature increases. Accordingly, a voltage of the bias node 101 in which a voltage increases by the amount of voltage dropped by the variable resistor 12, can also have a negative temperature characteristic. Thereby, since the gate voltage Vg with the negative temperature characteristics can be supplied to the gate of the NMOS transistor 25, the drain current Id of the NMOS transistor 25 which is biased by the gate voltage Vg with a negative temperature characteristic can also have a negative temperature characteristic. As the drain current Id of the NMOS transistor 25 has a negative temperature characteristic, the negative temperature characteristic can be offset by the positive temperature characteristics of the leakage current Is of the PMOS transistor 27. Thus, it is possible to charge the first node 201 of the delay adjustment circuit 20, using a current whose change is controlled depending on the temperature change.

FIG. 3B is a diagram illustrating a relationship between the voltage of the bias node 101, that is, the gate voltage Vg which is applied to the gate of the NMOS transistor 25 and temperature. The gate voltage Vg has the negative temperature characteristics in which the voltage decreases as the temperature increases. A value of the gate voltage Vg can be increased or decreased by adjusting a value of the variable resistor 12. The gate voltage Vg can be increased by increasing the resistance value of the variable resistor 12. The drain current Id of the NMOS transistor 25 can be increased by increasing the gate voltage Vg. Since charging time of the first node 201 can be adjusted by increasing or decreasing the drain current Id, the oscillation frequency can be adjusted. That is, since the charging time of the first node 201 can be shortened by increasing the drain current Id, the oscillation frequency of the oscillation circuit can increase. Variation of the oscillation frequency caused by variation in manufacturing conditions can be prevented by correcting variation of the drain current Id of the NMOS transistor 25 caused by variation in the manufacturing conditions.

According to the first embodiment in FIG. 1, the first node 201 can be charged by adjusting the leakage current Is with a positive temperature characteristic and the drain current Id with a negative temperature characteristic of the NMOS transistor 25, whereby the oscillation frequency can be adjusted. Since the value of the leakage current Is is small, the charging time of the first node 201 is lengthened, whereby the oscillation frequency can decrease. Accordingly, a capacitor with a large value is not required to be provided so as to decrease the oscillation frequency. Hence, since power consumption according to charging or discharging of a large capacitor can be reduced, it is possible to provide an oscillation circuit which can reduce the power consumption.

In addition, while the temperature characteristics are offset by the leakage current Is of the PMOS transistor 27 with a positive temperature characteristic and the drain current Id of the NMOS transistor 25 with a negative temperature characteristic, the first node 201 is charged, whereby the oscillation frequency can be adjusted. Accordingly, it is possible to provide an oscillation circuit which can maintain a stable frequency regardless of the temperature change.

Furthermore, the drain current Id of the NMOS transistor 25 can be adjusted by adjusting the value of the variable resistor 12 of the bias circuit 10 so as to adjust the gate voltage Vg of the bias node 101. Accordingly, it is possible to prevent the oscillation frequency from varying due to variation in the manufacturing conditions.

Second Embodiment

Figure 4A:
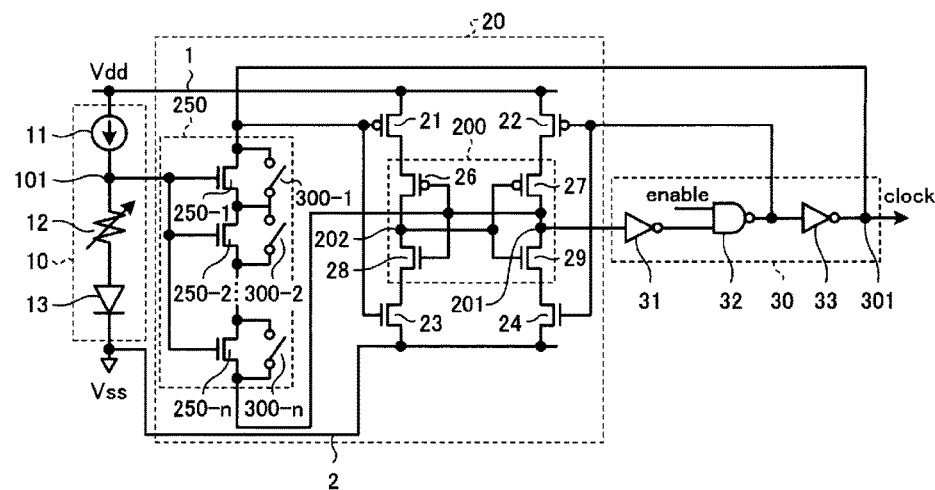
FIGS. 4A and 4B are diagrams illustrating a configuration of an oscillation circuit according to a second embodiment.
Figure 4B:
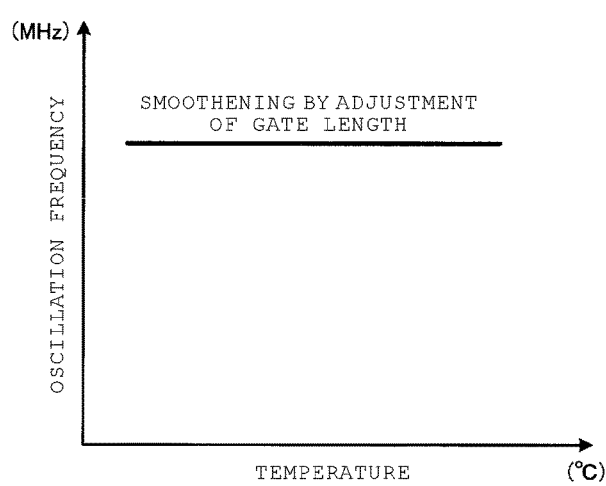

FIGS. 4A and 4B are diagrams illustrating a configuration of an oscillation circuit according to a second embodiment. The same symbols or reference numerals are given to configuration elements corresponding to those in the aforementioned embodiment, and repeated description is made only as needed. In the present embodiment, multiple NMOS transistors 250-1 to 250-n whose gates are biased by the bias circuit 10 are included to form a bias transistor. Source-drain paths of the multiple NMOS transistors 250-1 to 250-n are connected in series, and a source of the NMOS transistor 250-n in the final stage is connected to the first node 201 of the delay adjustment circuit 20. A drain of the NMOS transistor 250-1 in the first stage is connected to a gate of the PMOS transistor 21.

Switches 300-1 to 300-n are respectively connected in parallel between sources and drains of the NMOS transistors 250-1 to 250-n. An NMOS transistor corresponding to the NMOS transistor 25 in the embodiment in FIG. 1 includes the multiple NMOS transistors 250-1 to 250-n, and for the sake of convenience, an entire configuration which is made by the multiple NMOS transistors 250-1 to 250-n and the switches 300-1 to 300-n is also called an NMOS transistor. As the switches 300-1 to 300-n are turned on, sources and drains of the NMOS transistors 250-1 to 250-n corresponding thereto are short-circuited. Hence, a gate length of the NMOS transistor 250 which includes the multiple NMOS transistors 250-1 to 250-n can be adjusted by turning on or off each of the switches 300-1 to 300-n. A slope of the drain current Id can be adjusted by adjusting the gate length of the NMOS transistor 250. That is, the temperature characteristics of the drain current Id of the NMOS transistor 250 can be adjusted. Accordingly, the negative temperature characteristics of the NMOS transistor 250 can be adjusted according to the positive temperature characteristics of the leakage current Is which is supplied by the PMOS transistor 27 of the delay adjustment circuit 20. Thus, it is possible to offset the temperature characteristics of a current which is supplied from the current supply path of the leakage current Is of the PMOS transistor 27 and the current supply path of the drain current Id of the NMOS transistor 250 more accurately.

FIG. 4B is a diagram illustrating effect of smoothening of the oscillation frequency which is performed by adjustment of the gate length of the NMOS transistor 250. By adjusting the gate length of the NMOS transistor 250, the negative temperature characteristics of the drain current Id of the NMOS transistor 250 are adjusted, the negative temperature characteristics are offset by the positive temperature characteristics of the leakage current Is of the PMOS transistor 27, whereby temperature dependency of the charging and discharging time of the first node 201 of the delay adjustment circuit 20 is reduced. Accordingly, it is possible to prevent the oscillation frequency from varying due to temperature change.

Figure 5:
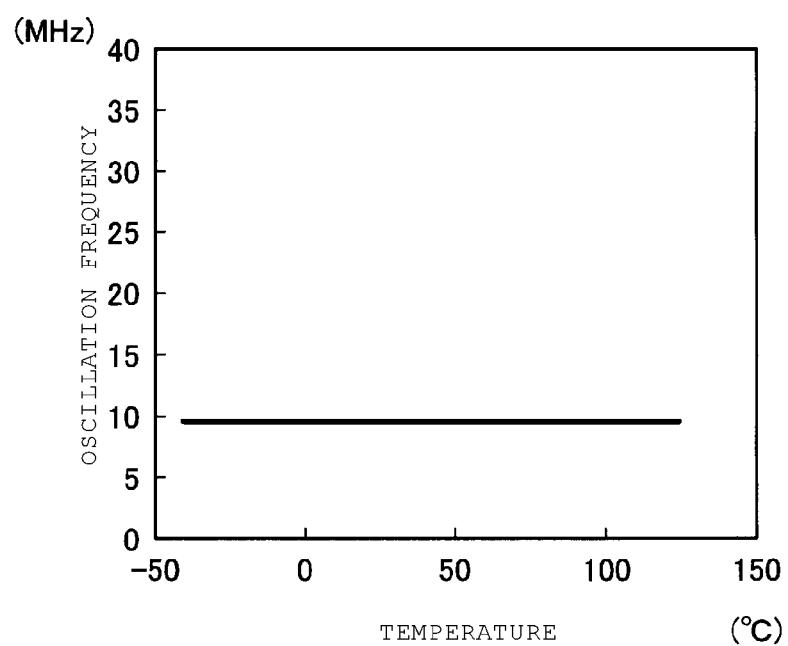
FIG. 5 is a diagram illustrating simulation results.

FIG. 5 illustrates simulation results of a relationship between the oscillation frequency of the oscillation circuit according to the second embodiment and the temperature. The simulation results show that variation of the oscillation frequency can be reduced to ±3% with respect to the temperature change of −40° C. to +125° C.

Third Embodiment

Figure 6:
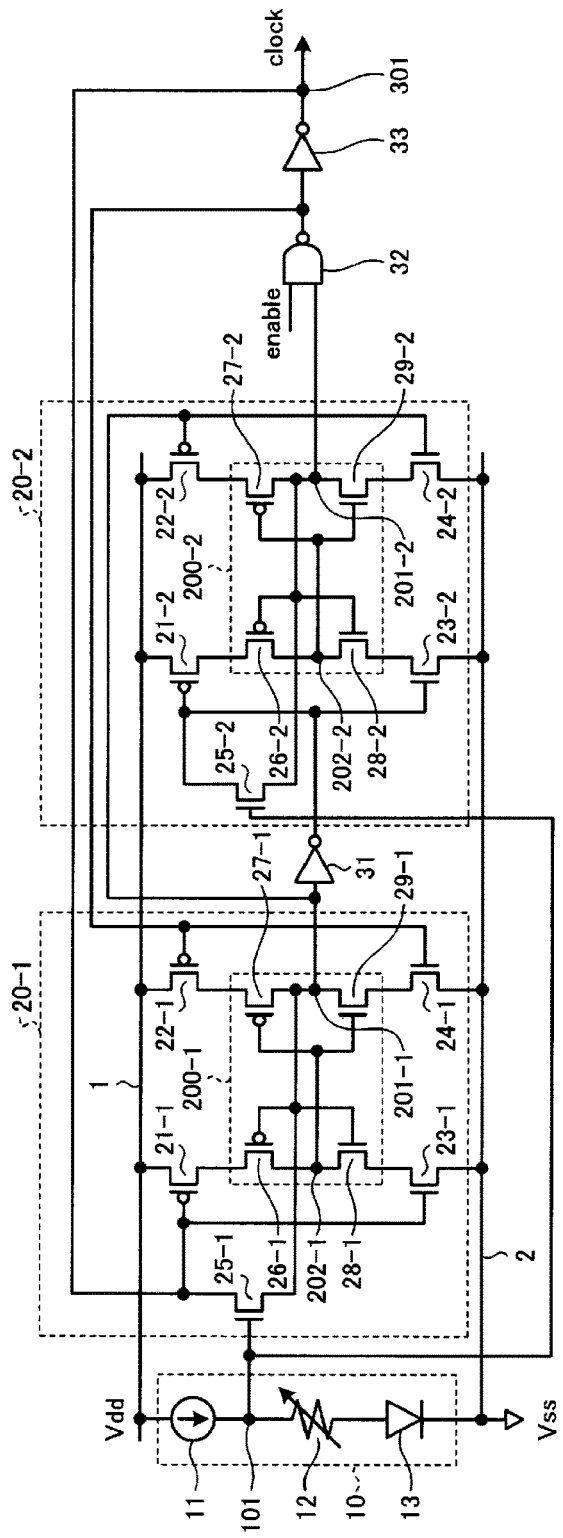
FIG. 6 is a diagram illustrating a configuration of an oscillation circuit according to a third embodiment.

FIG. 6 is a diagram illustrating a configuration of an oscillation circuit according to a third embodiment. The same symbols or reference numerals are given to configuration elements corresponding to those in the aforementioned embodiments, and repeated description is made only as needed. An oscillation circuit according to the present embodiment includes a first delay adjustment circuit 20-1 which is provided on an input terminal side of the inverter 31, and a second delay adjustment circuit 20-2 which is provided on an output terminal side of the inverter 31.

The first delay adjustment circuit 20-1 includes a PMOS transistor 21-1 and a PMOS transistor 22-1, each source of which is connected to the first power supply line 1. A drain of an NMOS transistor 25-1 (a bias transistor) is connected to a gate of the PMOS transistor 21-1.

The first delay adjustment circuit 20-1 includes an NMOS transistor 23-1 and an NMOS transistor 24-1, each source of which is connected to the second power supply line 2. A gate of the NMOS transistor 23-1 is connected to the gate of the PMOS transistor 21-1, and a gate of the NMOS transistor 24-1 is connected to a gate of the PMOS transistor 22-1.

A latch circuit 200-1 is connected between drains of the PMOS transistors 21-1 and 22-1 and drains of the NMOS transistors 23-1 and 24-1. The latch circuit 200-1 includes two PMOS transistors 26-1 and 27-1 and two NMOS transistors 28-1 and 29-1. A source of the PMOS transistor 26-1 is connected to a drain of the PMOS transistor 21-1, and a source of the PMOS transistor 27-1 is connected to a drain of the PMOS transistor 22-1.

A source of the NMOS transistor 28-1 is connected to a drain of the NMOS transistor 23-1, and a source of the NMOS transistor 29-1 is connected to the drain of the NMOS transistor 24-1. A gate of the PMOS transistor 26-1 and a gate of the NMOS transistor 28-1 are corresponding to each other, and are connected to a node 201-1. A gate of the PMOS transistor 27-1 and a gate of the NMOS transistor 29-1 are connected to each other, and are connected to a node 202-1. The PMOS transistor 26-1 and the NMOS transistor 28-1 configure an inverter, and the PMOS transistor 27-1 and the NMOS transistor 29-1 also configure an inverter. Hence, the latch circuit 200-1 includes two inverters. An input of one of the inverters is cross-connected to an output of the other inverter. A source of the NMOS transistor 25-1 (the bias transistor) is connected to the node 201-1.

The second delay adjustment circuit 20-2 includes a PMOS transistor 21-2 and a PMOS transistor 22-2, each source of which is connected to the first power supply line 1. A drain of an NMOS transistor 25-2 (a bias transistor) is connected to a gate of the PMOS transistor 21-2.

The second delay adjustment circuit 20-2 includes an NMOS transistor 23-2 and an NMOS transistor 24-2, each source of which is connected to the second power supply line 2. A gate of the NMOS transistor 23-2 is connected to a gate of the PMOS transistor 21-2, and a gate of the NMOS transistor 24-2 is connected to a gate of the PMOS transistor 22-2.

A latch circuit 200-2 is connected between drains of the PMOS transistors 21-2 and 22-2 and drains of the NMOS transistors 23-2 and 24-2. The latch circuit 200-2 includes two PMOS transistors 26-2 and 27-2 and two NMOS transistors 28-2 and 29-2. A source of the PMOS transistor 26-2 is connected to a drain of the PMOS transistor 21-2, and a source of the PMOS transistor 27-2 is connected to a drain of the PMOS transistor 22-2. Gates of the PMOS transistor 21-1 and the NMOS transistor 23-2 are connected to an output terminal of the inverter 31.

A source of the NMOS transistor 28-2 is connected to a drain of the NMOS transistor 23-2, and a source of the NMOS transistor 29-2 is connected to a drain of the NMOS transistor 24-2. A gate of the PMOS transistor 26-2 and a gate of the NMOS transistor 28-2 are connected to each other and are connected to a node 201-2. A gate of the PMOS transistor 27-2 and a gate of the NMOS transistor 29-2 are connected to each other and are connected to a node 202-2. The PMOS transistor 26-2 and the NMOS transistor 28-2 configure an inverter, and the PMOS transistor 27-2 and the NMOS transistor 29-2 also configure an inverter. Hence, the latch circuit 200-2 includes two inverters. An input of one of the inverters is cross-connected to an output of the other inverter. A source of the NMOS transistor 25-2 (the bias transistor) is connected to the node 201-2.

The node 201-2 of the second delay adjustment circuit 20-2 is connected to one input terminal of the NAND circuit 32. An output terminal of the NAND circuit 32 is connected to the gates of the PMOS transistor 22-1 and NMOS transistor 24-1 of the first delay adjustment circuit.

The output terminal of the NAND circuit 32 is connected to an input terminal of the inverter 33. An output terminal of the inverter 33 is connected to an output node 301, and is connected to gates of the PMOS transistor 21-1 and the NMOS transistor 23-1 in the first delay adjustment circuit 20-1.

In the oscillation circuit according to the present embodiment, a signal on the input terminal side of the inverter 33 is supplied to the gates of the PMOS transistor 22-1 and the NMOS transistor 24-1 in the first delay adjustment circuit 20-1, and a signal on an output terminal side of the inverter 33 is connected to the gates of the PMOS transistor 21-1 and the NMOS transistor 23-1, in the same manner as the oscillation circuit according to the first embodiment illustrated in FIG. 1 described above. Hence, in the node 201-1 of the first delay adjustment circuit 20-1, the leakage current Is of the PMOS transistor 27-1 with the positive temperature characteristics and the drain current Id of the NMOS transistor 25-1 with the negative temperature characteristics are added together by the same operation as the operation described with reference to FIG. 2, and a charging operation is performed by a current whose positive and negative temperature characteristics are offset. In addition, discharging of the node 201-1 is also performed by a sum of the leakage current Is of the NMOS transistor 29-1 with the positive temperature characteristics and a current flowing through the NMOS transistor 25-1 with the negative temperature characteristics, that is, a current whose temperature characteristics are offset. Thus, it is possible to perform a stable discharging operation with respect to the temperature change.

In the same manner, a signal on an input terminal side of the inverter 31 is supplied to gates of the PMOS transistor 22-2 and the NMOS transistor 24-2 in the second delay adjustment circuit 20-2, and a signal on an output terminal side of the inverter 31 is connected to the gates of the PMOS transistor 21-2 and the NMOS transistor 23-2. Hence, in the node 201-2 of the second delay adjustment circuit 20-2, the leakage current Is of the PMOS transistor 27-2 with the positive temperature characteristics and the drain current Id of the NMOS transistor 25-2 with the negative temperature characteristics are added together by the same operation as the operation described with reference to FIG. 2, and charging is performed by a current whose positive and negative temperature characteristics are offset. In addition, discharging of the node 201-2 is also performed by a sum of the leakage current Is of the NMOS transistor 29-2 with the positive temperature characteristics and a current flowing through the NMOS transistor 25-2 with the negative temperature characteristics, that is, a current whose temperature characteristics are offset. Thus, it is possible to perform a stable discharging operation with respect to the temperature change.

In the present embodiment, the first delay adjustment circuit 20-1 and the second delay adjustment circuit 20-2 are provided respectively corresponding to the inverters 31 and 33 of two stages which respectively configure the delay circuits. Each of the delay adjustment circuits 20-1 and 20-2 adjusts the delay time using the current whose temperature characteristics are offset. Thus, it is possible to provide an oscillation circuit in which variation with respect to the temperature change is prevented. In addition, since the delay time is adjusted by a total of the delay times of the respective delay adjustment circuits 20-1 and 20-2, the oscillation frequency of the oscillation circuit can be widely adjusted by adjusting the respective delay times.

The oscillation circuit according to one embodiment employs a configuration in which the NAND circuit 32 receiving the enable signal "enable" is included and three stages of the circuits which invert levels of signals that are input are included. However, the oscillation circuit can include an inverter of one stage and one delay adjustment circuit 20. That is, the embodiment in FIG. 1 can also employ a configuration in which the inverter 31 and the NAND circuit 32 are omitted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. An oscillation circuit comprising:
a delay circuit that includes a first inverter having an input terminal connected to a first node; and
a delay adjustment circuit including a first current supply path and a second current supply path through which the first node is charged in response to an output signal of the delay circuit, wherein,
during charging of the first node, a current with positive temperature characteristics is supplied to the first node through the first current supply path, and a current with negative temperature characteristics is supplied to the first node through the second current supply path, and
the second current supply path includes a source-drain path of an NMOS transistor having a gate to which a bias voltage with negative temperature characteristics is applied.
2. The circuit according to claim 1, wherein
the first current supply path includes a source-drain path of a MOS transistor which is connected between the first node and a first power supply line, and
the current with positive temperature characteristics is supplied to the first node by applying a signal to a gate of the MOS transistor to turn off the MOS transistor when a voltage of the first node is transitioned from an L level to an H level.
3. The circuit according to claim 1,
wherein the bias voltage is supplied by a bias circuit including a constant current source, a variable resistor, and a diode, which are connected in series.
4. The circuit according to claim 1, wherein the delay adjustment circuit includes
a first PMOS transistor having a source that is connected to a first power supply line, and a gate to which the output signal of the delay circuit is supplied,
a second PMOS transistor having a source that is connected to the first power supply line, and a gate to which a signal that is inverted with respect to the output signal of the delay circuit is supplied from the delay circuit,
a first NMOS transistor having a source that is connected to a second power supply line, and a gate that is connected to the gate of the first PMOS transistor,
a second NMOS transistor having a source that is connected to the second power supply line, and a gate that is connected to the gate of the second PMOS transistor,
a third PMOS transistor having a source that is connected to a drain of the first PMOS transistor, and a gate that is connected to the first node,
a fourth PMOS transistor having a source that is connected to a drain of the second PMOS transistor, and a gate that is connected to a drain of the third PMOS transistor, a third NMOS transistor having a source that is connected to a drain of the first NMOS transistor, a gate that is connected to a drain of the fourth PMOS transistor, and a drain that is connected to the drain of the third PMOS transistor, and a fourth NMOS transistor having a source that is connected to a drain of the second NMOS transistor, a gate that is connected to the drain of the third PMOS transistor, and a drain that is connected to the drain of the fourth PMOS transistor.

5. An oscillation circuit comprising:

a delay circuit that includes a first inverter having an input terminal connected to a first node; and a delay adjustment circuit including a first current supply path and a second current supply path through which the first node is charged in response to an output signal of the delay circuit, wherein, during charging of the first node, a current with positive temperature characteristics is supplied to the first node through the first current supply path, and a current with negative temperature characteristics is supplied to the first node through the second current supply path, and the second current supply path includes source-drain paths, which are connected in series, of multiple MOS transistors having gates that are connected together.

6. The circuit according to claim 5, wherein the first current supply path includes a source-drain path of a MOS transistor which is connected between the first node and a first power supply line, and the current with positive temperature characteristics is supplied to the first node by applying a signal to a gate of the MOS transistor to turn off the MOS transistor when a voltage of the first node is transitioned from an L level to an H level.

7. An oscillation circuit comprising:

a first power supply line;
a second power supply line;
a first node;
a bias circuit between the first power supply line and the second power supply line, and configured to output a bias voltage with negative temperature characteristics;
a delay circuit that includes an inverter of at least one stage to which a signal of the first node is supplied; and
a delay adjustment circuit configured to charge the first node in response to an output signal of the delay circuit, wherein the delay adjustment circuit includes a first current supply path through which a current with positive temperature characteristics is supplied to the first node when a voltage of the first node increases, and a second current supply path that includes source-drain paths, that are connected in series, of multiple NMOS transistors having gates to which the bias voltage is supplied, and through which a current with negative temperature characteristics is supplied to the first node in response to an output signal of the delay circuit, when the voltage of the first node increases.

8. The circuit according to claim 7, further comprising:

a plurality of switches, each of which is connected between a source and a drain of one of the multiple NMOS transistors.

9. The circuit according to claim 7, wherein the bias circuit includes a constant current source, a variable resistor, and a diode, which are connected in series.

10. The circuit according to claim 7, wherein the delay adjustment circuit includes a first PMOS transistor having a source that is connected to the first power supply line, and a gate to which the output signal of the delay circuit is supplied, a second PMOS transistor having a source that is connected to the first power supply line, and a gate to which a signal that is inverted with respect to the output signal of the delay circuit is supplied from the delay circuit, a first NMOS transistor having a source that is connected to the second power supply line, and a gate that is connected to the gate of the first PMOS transistor, a second NMOS transistor having a source that is connected to the second power supply line, and a gate that is connected to the gate of the second PMOS transistor, a third PMOS transistor having a source that is connected to a drain of the first PMOS transistor, and a gate that is connected to the first node, a fourth PMOS transistor having a source that is connected to a drain of the second PMOS transistor, and a gate that is connected to a drain of the third PMOS transistor, a third NMOS transistor having a source that is connected to a drain of the first NMOS transistor, a gate that is connected to a drain of the fourth PMOS transistor, and a drain that is connected to the drain of the third PMOS transistor, and a fourth NMOS transistor having a source that is connected to a drain of the second NMOS transistor, a gate that is connected to the drain of the third PMOS transistor, and a drain that is connected to the drain of the fourth PMOS transistor.

11. An oscillator circuit comprising:

a bias circuit that supplies an adjustable bias voltage at a bias node;

a delay adjustment circuit including a latch circuit having a first node and a second node, the latch circuit supplying current having positive temperature characteristics to the first node and a bias transistor having a gate connected to the adjustable bias voltage at the bias node to supply current having negative temperature characteristics to the first node; and a delay circuit configured to invert a voltage of the first node, the delay circuit having an input connected to the first node and an output connected to a drain of the bias transistor.

12. The oscillator circuit according to claim 11, wherein the bias circuit includes a current source, a resistor, and diode connected in series and between a power supply node and ground node, the bias node being located between the current source and the resistor.

13. The oscillator circuit according to claim 12, wherein the resistor is a variable resistor.

14. The oscillator circuit according to claim 12, wherein the diode has negative temperature characteristics.

15. The oscillator circuit according to claim 12, wherein the current source is a fixed current source.

16. The oscillator circuit according to claim 12, wherein the bias transistor includes:

a plurality of switches; and a plurality of transistors, each having a gate and a channel that is connected in parallel to one of the switches, wherein the channels of the transistors are connected in series between the output of the delay circuit and the input of the delay circuit, and the gates of the transistors are connected to the bias node.

17. The oscillator circuit according to claim 11, wherein the latch circuit includes a first MOS inverter and a second MOS inverter, the first node located between an output of the first MOS inverter and an input of the second MOS inverter, the second node located between an output of the second MOS inverter and the input of the first MOS inverter.

18. The oscillator circuit according to claim 17, wherein each of the first and second MOS inverters includes a P-channel and a N-channel transistor.

19. The oscillator circuit according to claim 17, wherein the delay adjustment circuit includes first, second, third and fourth MOS transistors, each having a gate and a channel;

the channels of the first and second MOS transistors are respectively connected between a voltage supply node and the first and second MOS inverters and the channels of the third and fourth MOS transistors are respectively connected between a ground node and the first and second MOS inverters; and the gates of the first and third MOS transistors are connected to the output of the delay circuit and the gates of the second and fourth MOS transistors are connected to a logical level derived from the input of the delay circuit.

20. The oscillator circuit according to claim 11, wherein the delay circuit includes:

a first inverter having an output and an input that is connected to the first node of the delay adjustment circuit;

a second inverter having an input and an output that is the output of the delay circuit; and a NAND gate having a first input connected to the output of the first inverter, an output connected to the input of the second inverter, and a second input for an enable signal.

* * * * *